United States Patent [19]

Koning et al.

[11] Patent Number: 4,788,102
[45] Date of Patent: Nov. 29, 1988

[54] DATA-CARRYING CARD, METHOD FOR PRODUCING SUCH A CARD, AND DEVICE FOR CARRYING OUT SAID METHOD

[75] Inventors: Anthony A. Koning, Haren; Wim Dijkhuizen, Zuidlaren, both of Netherlands

[73] Assignee: Papier-Plastic-Coating Groningen B.V., Groningen, Netherlands

[21] Appl. No.: 53,131

[22] Filed: May 21, 1987

[30] Foreign Application Priority Data

May 30, 1986 [NL] Netherlands ............... 8601404

[51] Int. Cl.⁴ ............................................. A61F 13/02
[52] U.S. Cl. ................................. 428/40; 428/41; 428/209; 428/212; 428/915; 428/916
[58] Field of Search ............... 428/40, 41, 209, 212, 428/915, 916

[56] References Cited

U.S. PATENT DOCUMENTS

| | | | |
|---|---|---|---|
| 3,870,582 | 3/1975 | Brackett et al. | 156/306 |
| 4,101,701 | 7/1978 | Gordon | 428/189 |
| 4,128,696 | 12/1978 | Goebel et al. | 428/424 |
| 4,343,851 | 8/1982 | Sheptak | 428/212 |
| 4,344,998 | 8/1982 | de Leeuw et al. | 428/212 |
| 4,506,915 | 3/1985 | Haghiri-Tehrani et al. | 283/75 |

FOREIGN PATENT DOCUMENTS 0097206 1/1984 European Pat. Off. .

OTHER PUBLICATIONS

Handbook of Adhesives, 2nd Ed., Sheist, Van Nostrand Reinhold Company, 1977, pp. 6-8 and 441.

Primary Examiner—John E. Kittle
Assistant Examiner—P. J. Ryan
Attorney, Agent, or Firm—Kramer, Brufsky & Cifelli

[57] ABSTRACT

Data-carrying card comprising multiple layers which have been connected to each other with use of an adhesive and excluding the application of heat and pressure. In particular the invention relates to a card as described which incorporates an integrated electronic circuit. The invention also relates to a method for producing a card as described and to a device for carrying out said method.

9 Claims, 2 Drawing Sheets

DATA-CARRYING CARD, METHOD FOR PRODUCING SUCH A CARD, AND DEVICE FOR CARRYING OUT SAID METHOD

The invention relates to a data-carrying card which is made up of several layers, in which each of the layers is processed in the manner suitable for that layer, and the layers are connected to each other in the correct order by means of lamination.

Such data-carrying cards are generally known and can be used for many different purposes. For example, such cards may serve as identity cards and in that case contain data which are characteristic of the bearer of the card. Another purpose of the card can be as a means of payment. Known in this respect are debit cards and credit cards, of which there are very many in circulation in widely varying forms. There are also all kinds of ways for reading the data contained by the card. The data can be provided in or on the card in the form of readable or palpable elements. The card also often has a personalised imprint, which may or may not be provided in relief. Often the card has a part on which the holder can write his personal signature and also details which make forging difficult. For use in machines, such cards are also often provided with a machine read and write medium; for example, a magnetic strip is very generally used. Another form used in that respect is a card comprising an integrated electronic circuit. Such a circuit can contain a very large amount of information concerning the bearer and the financial facilities or extent of such financial facilities etc. which should be made available to him, it being possible to read such data in a simple manner with the aid of the equipment possessed by the transaction-effecting bodies. If an integrated electronic circuit is incorporated in the card, said circuit will in general be inside the card, while one or more points by means of which the information in the circuit can be read are conveyed out to one or both outside surfaces of the data-carrying card.

Such data-carrying cards are generally made up of several plastics layers, and these cards are made by providing the layers which are to make up the card individually with the data to be placed on them, for example in the form of imprint, relief, magnetic information etc., and then positioning the parts from which the card is to be made up in register on top of each other, following which a lamination step is carried out using heat and pressure. For the known data-carrying cards very often use is made of polyvinylchloride. During the lamination step, the heat and the pressure applied will cause at least part of the component parts of the card to exhibit a melting tendency, resulting in adhesion of the various layers to each other. Such known data-carrying cards have the disadvantage that, due to the necessary use of heat and pressure in their production, one is very limited in the choice of materials from which the card is made, and during mass production the percentage of rejects is generally fairly high. In cases in which an integrated electronic circuit has to be incorporated in the card the use of heat and pressure in particular also leads to a high percentage of rejects, which pushes up the cost of such cards.

The object of the present invention is to find a solution to the above problem, as a result of which it becomes possible to produce data-carrying cards made up of several layers without being hampered in the choice of materials, and where the percentage of rejects is radically reduced.

The data-carrying card according to the present invention is to this end characterized in that, prior to the lamination, at least on one of each pair of surfaces to be joined together by lamination an adhesive or adhesive component has been applied which by itself or together with one or more other components can ensure adhesion of the layers at ambient temperature and without high pressure.

In this case ambient temperature is understood to mean a temperature which does not exceed 50 degrees C., and any pressure which may be applied is deemed to be no higher than 3 kg per square cm.

Through the use of adhesives which can ensure adhesion of the layers to each other at ambient temperature and without the use of high pressure, a very considerable reduction in the percentage of rejects during the production of cards is achieved, and there is no restriction of any kind now as regards the choice of materials for making the card. The choice of material is in that case determined only by the existence of a suitable adhesive and, of course, by the processing possibilities for such an adhesive.

Any material may be used for the cards according to the invention as long as combining of layers may be obtained with use of an adhesive; of the plastics material, nonrestrictive, may be mentioned polyvinylchloride, polyester, polycarbonate and polyester.

The application of adhesive or adhesive components to one or more surfaces which are to be laminated to each other can take place in many different ways.

For example, the screenprinting technique can advantageously be used for the application of adhesive layers or adhesive component layers. The screenprinting technique has the advantage that layers of relatively great thickness may be applied with it, with the result that the adhesive layer can ensure that any unevennesses present in the component layers of the card are filled up. The weight of the layer thus applied can vary and be precisely set within wide limits. The screen printing technique also permits patterntype application of relatively thick layers, so that account can be taken of recesses and interruptions in the layers of the card.

Another technique which can be used is "transfer coating". For this, the adhesive or adhesive component layer to be applied to the surface of the component parts is first applied to a "transfer web". Such a web can, for example, be made of paper which is provided with a silicone or polytetrafluoroethylene layer. Through the presence of such a layer, the application of an adhesive layer to it works very well, but there is very little adhesion between the adhesive layer and the release layer. The surface to be coated with adhesive or adhesive component is now brought into contact with the adhesive layer on the transfer paper, bonding between adhesive layer and the surface contacted with it will take place; on separation of the surface to be coated from the transfer paper with adhesive, the adhesive will stick to the surface of the card part to be coated, so that in this way a very uniform coating of the surface to be coated is achieved. The application of the adhesive layer to the transfer paper can, of course, take place in all kinds of ways, for example pattern coating, spraying techniques etc.

In particular, the adhesive consists of a mixture comprising one or more components which is applied to one of the surfaces of each pair of surfaces which are to be joined together by lamination. In such a case, one could, for example, use a slow-reacting multi-component adhesive system which hardens with time without high pressure and at ambient temperature. One could also use an adhesive which with the exclusion of atmospheric oxygen gives an immediate bond if the surface to which this adhesive is applied is brought into contact with another surface.

The adhesive for the data-carrying card according to the invention advantageously consists of at least two components reacting with each other, whereby one of the components or a group of components not reacting by itself is applied to each of the surfaces of a pair to be joined together by lamination.

In that case, one has to think of multi-part adhesive systems in which the reactivity between the individual components is so great that the standing time thereof is too short for use in the production of these data-carrying cards. In that case the individual components can each be applied to one of the surfaces to be joined together, and the reaction can commence when the two surfaces have been brought into contact with each other. The application of such adhesive component layers can take place again in the manner described above. In the case of a multi-part adhesive system, it could be a curing system which after curing is thermostable or thermoplastic, while within the scope of the invention only systems which can cure at ambient temperature are feasible. Examples of systems which can be used are epoxy, polyester and acrylate systems.

It has been found advantageous according to the invention to subject the multi-layer card after lamination to a treatment with actinic radiation and/or to leave the card lying at ambient temperature to complete the adhesion reaction.

In the case of adhesive systems hardening under the influence of actinic radiation, it is very attractive to produce the whole card in a lamination process of the known type, in which part of the card surface (e.g. the edges) is exposed to heat and pressure. This ensures the desired register accuracy of the parts placed on top of each other. The adhesive layer is then hardened by means of actinic radiation, such as ultraviolet radiation. When such radiation-hardening is used, a certain post-hardening will generally take place after the end of the exposure to radiation, so that the card can expediently be left for some further time at ambient temperature to complete the bonding reaction. Such a post-hardening effect can also be advantageous in the use of a multi-part system which hardens chemically at ambient temperature.

Of course, in order to obtain proper register accuracy, the adhesive system can be built up over the surface in several phases. In a number of places the adhesive can be contact adhesive, which results in an immediate bonding on lamination, so that the register can be maintained with great accuracy. The remainder of the surface can then have on it radiation-curing adhesive which is hardened in a separate step. The contact adhesive points can also be outside the format of the card, on parts which are removed in a finishing operation on the card.

The above-described local bonding of parts of the card can, if used for the edges, be advantageous for combating the undesirable splitting of a card into separate layers by the holder. Such edge sealing can take place through the use of heat and pressure; in particular, an ultrasonic welding process is very suitable.

In a very advantageous embodiment of the card according to the invention, at least a part of the layers of the card is fully or partially formed by at least one integrated electronic circuit, while optionally provision is made in at least a part of the remaining layers for recesses for the passage of one or more outlets of the circuit to one or both outer surfaces of the card.

Due to the fact that no heat and/or high pressure is used in the production, damage to the integrated electronic circuit is prevented, and the percentage of rejects occurring in consequence of those operations which are normal in the usual processes will be very greatly reduced. It is pointed out in this connection that when such cards containing electronic circuits had to be produced by the processes used hitherto, in general all layers of the card were joined under the supply of heat and pressure, including the integrated electronic circuit provided, possibly in a recess made for the purpose.

Another method consists of the assembly, by known means, of a plastic-containing card which is subsequently provided with a hollow which provides space for an integrated circuit element. Said integrated circuit element is then introduced from the outside and fixed with adhesive. In this last method, the effect of heat and pressure on the integrated circuit is excluded through the fact that the circuit is not hermetically packed between the layers, but there is a great risk of damage and possibly misuse.

The cards according to the invention are manufactured without the application of heat and/or high pressure during the lamination process, so that damage to the electronic circuit is effectively prevented.

In a very advantageous embodiment of the card according to the invention, the electronic circuit is incorporated in a carrier sheet which has at least the same dimensions as the other component layers of the card.

This means that the electronic circuit is incorporated in foil material which extends all the way round a flat integrated circuit, and which is at least the same size as the other component layers of the card.

The invention also relates to a method for producing a data-carrying card according to one or more of the preceding embodiments in which each of the layers from which the card is formed is processed in the manner suitable for that layer, after which the layers are joined together in the correct order by lamination, characterized in that, after the processing and prior to the lamination, on at least one surface of every two surfaces which are to be joined together by lamination is applied an adhesive or adhesive component which by itself or together with one or more other components can ensure adhesion at ambient temperature without high pressure.

In the carrying out of the method for producing a data-carrying card, the various layers of the card will generally be laminated without heat and high pressure, after which the cards are made ready for use, possibly by punching or cutting.

The above-described method according to the invention is very advantageously carried out in such a way that of at least part of the layers of the card a great number of the same layers are always accommodated in a sheet and/or web and that during the lamination process this form is retained. If some of or all layers of the card are arranged in sheets and/or webs, each of the particular sheets and/or webs can always be given the necessary processing such as data imprint, colour and pattern imprint, application of adhesive etc., following which the different layers can join each other in a lamination device, in which each of the layers is brought into precise register with the other layers and lamination then takes place. Following the lamination step, the laminate formed and containing many cards can be subjected to radiation treatment, stored for some time for a post-hardening treatment or divided directly into complete cards by means of suitable equipment.

Finally, the invention is embodied in a device for the continuous carrying out of the above-described process, which is characterized in that the device has a number of processing stations and guide means for processing of sheets and/or webs carrying card parts and the guidance thereof to a lamination station.

The invention will now be explained with reference to the drawings, in which.

Figure 1:
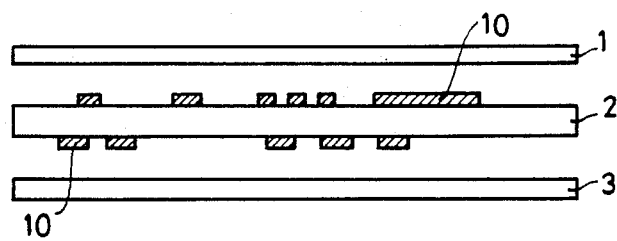
FIG. 1 represents a section through a data-carrying card, with the component parts shown separately.

FIG. 1 shows by reference number 1 a covering layer, while the intermediate layer 2 bearing the information 10 is disposed between the two covering layers. Shown here is a card consisting of 3 layers, but the number of layers can, of course, vary within the desired total thickness of the card.

Figure 2:
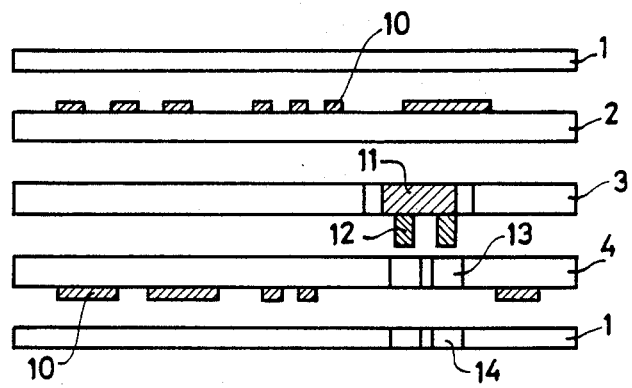
FIG. 2 shows a card of the type in FIG. 1, in which an integrated electronic circuit is incorporated.

FIG. 2 shows by reference number 1 again covering layers, 2 and 4 are information-carrying layers, while layer 3 shows a hollow for the accommodation of an integrated electronic circuit 11 with passages 12. These passages 12 fall in recesses 13 and 14 in the layers 4 and 1, as indicated, and end in the bottom external surface of the finished card. The information stored in the circuit can be read by electronic means.

In the event of use of "contactless-read" electronic circuits, the recesses 13 can, of course, be dispensed with, since there are no passages 12.

Figure 3:
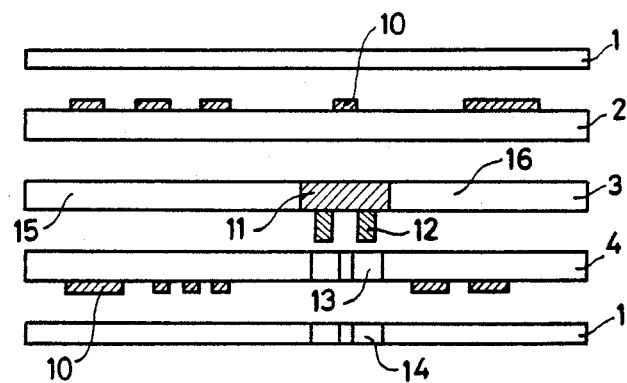
FIG. 3 shows another embodiment of a card in which an integrated electronic circuit is incorporated.

FIG. 3 shows a data-carrying card as in FIG. 2, but the integrated electronic circuit is incorporated in layer 3 and parts 15 and 16 of the layer 3 are fixed to the integrated electronic circuit 11. The part 3 has the same dimensions as the parts 1, 2 and 4 of the card.

This embodiment of a card according to FIG. 3 is particularly suitable for an automated continuous production of cards.

Figure 4:
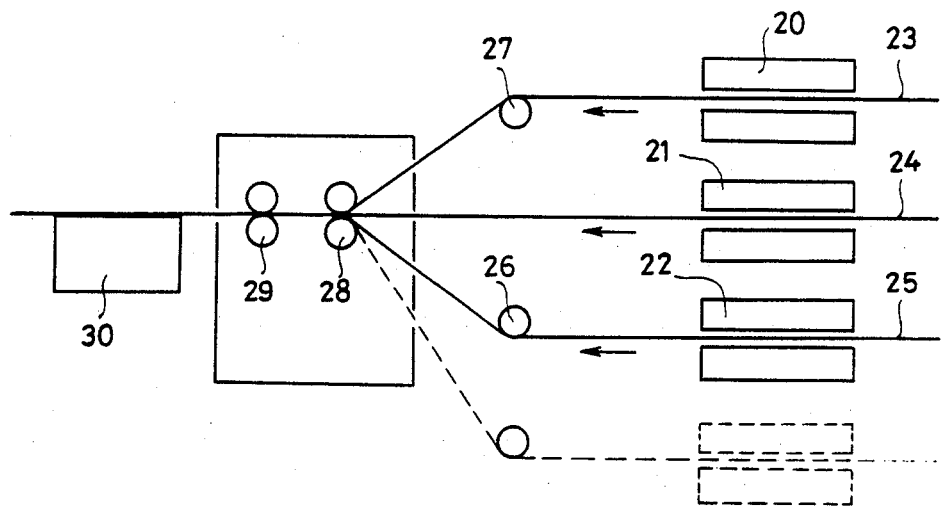
FIG. 4 is a schematic illustration of a device for continuous carrying out of a processing operation and lamination which leads to a web or sheets with fully assembled cards.

FIG. 4 shows schematically a device for the continuous carrying out of a card production process, in which the card parts are accommodated in sheets and/or webs 23, 24, 25 etc. which are processed in stations 20, 21 and 22 (application of imprint, relief, adhesive, adhesive components etc.), after which guide elements 26, 27 take the webs and/or sheets to lamination station 28, 29, where the component card parts are joined together. It is pointed out that where sheets are used the lines 23, 24, 25 etc. symbolise sheet conveyance means which can consist of an endless belt; a roller belt etc.

Of course, in such a device the registration of the various webs relative to each other is extremely important, but such registration is common in the printing trade and is not described specially here. On leaving the lamination station, the sheets and/or webs formed, with cards, are further processed or stored for further processing. Prior to the further processing, an electrical and/or other physical check or information infeed may be carried out. Any faulty specimens can then be recycled, which is particularly important for circuit-containing cards.

The further processing can also consist of radiation hardening treatment, storage for producing a post-hardening reaction, punching etc.

We claim:

1. A data-carrying card comprising:
   at least three layers comprising a first outer cover layer, a second inner layer, and a third outer cover layer, said at least three layers being laminated to each other, said second layer including an integrated circuit; and
   adhesive means, coating at least one of each pair of adjacent surfaces of said layers, for bonding said pairs of adjacent surfaces at ambient temperature without high pressure to form the lamination.

2. Data-carrying card according to claim 1, wherein the adhesive means comprises a mixture of one or more components which coat one of the surfaces of each pair of surfaces joined together by lamination.

3. Data-carrying card according to claim 1, wherein the adhesive means comprises at least two components reacting with each other, and one of the components not reacting by itself is applied to each of the surfaces of a pair to be joined together by lamination.

4. Data-carrying card according to claim 1, further comprising a carrier sheet which houses the integrated circuit, said carrier sheet being at least the same size as said first and third layers of the card.

5. Data-carrying card according to claim 1 wherein:
   said second layer further comprises outlet means, protruding from a surface of said second layer, for outputting data from said integrated circuit; and
   said third layer is adjacent to said outlet means and defines hole means for passing said outlet means to an outer surface of said card.

6. A method for producing a data-carrying card, comprising the steps of:
   registering a first outer cover layer, a second inner circuit layer, and a third outer cover layer, at least one of said layers having a non-uniform thickness, said second layer comprising an integrated circuit and an outlet protruding from a surface of said second layer, and said third layer being adjacent to said outlet and defining an aperture registered with said outlet to receive said outlet;
   applying a coat of adhesive which cures at ambient temperature without high pressure to at least one of each pair of adjacent surfaces of said layers, the application of adhesive to said non-uniformly thick layer being complementally non-uniform in thickness such that the resultant thickness of said card is uniform;
   uniting the coated layers together into a laminate; and
   curing said adhesive at or less than ambient temperature without high pressure.

7. A method according to claim 6 wherein the adhesive is cured at ambient temperature until an adhesion reaction is completed.

8. A method as set forth in claim 6 wherein the step of applying the adhesive comprises the step of coating by screen printing.

9. A method as set forth in claim 6 further comprising the step of exposing the coated and united layers to actinic radiation to complete an adhesion reaction.

* * * * *